United States Patent
Wu et al.

(10) Patent No.: US 11,169,207 B2
(45) Date of Patent: Nov. 9, 2021

(54) TESTING OF SEMICONDUCTOR CHIPS WITH MICROBUMPS

(71) Applicant: Taiwan Semiconductor Manufacturing Co., Ltd., Hsin-Chu (TW)

(72) Inventors: Wei-Cheng Wu, Hsinchu (TW); Hsien-Pin Hu, Zhubei (TW); Shang-Yun Hou, Jubei (TW); Shin-Puu Jeng, Hsinchu (TW); Chen-Hua Yu, Hsinchu (TW); Chao-Hsiang Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/869,775

(22) Filed: May 8, 2020

(65) Prior Publication Data

US 2020/0264231 A1    Aug. 20, 2020

Related U.S. Application Data

(63) Continuation of application No. 16/232,373, filed on Dec. 26, 2018, now Pat. No. 10,663,512, which is a
(Continued)

(51) Int. Cl.
*G01R 31/28* (2006.01)
*H01L 21/66* (2006.01)
(Continued)

(52) U.S. Cl.
CPC ....... *G01R 31/2896* (2013.01); *G01R 1/0416* (2013.01); *G01R 31/2601* (2013.01);
(Continued)

(58) Field of Classification Search
CPC ............ G01R 31/2896; G01R 31/2601; G01R 31/2884; G01R 31/2886; G01R 31/2889;
(Continued)

(56) References Cited

U.S. PATENT DOCUMENTS

| 4,811,082 | A | 3/1989 | Jacobs et al. |
| 4,990,462 | A | 2/1991 | Sliwa, Jr. |

(Continued)

FOREIGN PATENT DOCUMENTS

| CA | 2127234 | 1/1995 | |
| EP | 0632281 | 1/1995 | |
| EP | 0632281 A2 * | 1/1995 | ............. G01R 1/073 |

OTHER PUBLICATIONS

Non-Final Office Action dated May 16, 2013 for U.S. Appl. No. 13/025,931.
(Continued)

*Primary Examiner* — Patrick Assouad
*Assistant Examiner* — Sean Curtis
(74) *Attorney, Agent, or Firm* — Eschweiler & Potashnik, LLC

(57) ABSTRACT

A device includes a test pad on a chip. A first microbump has a first surface area that is less than a surface area of the test pad. A first conductive path couples the test pad to the first microbump. A second microbump has a second surface area that is less than the surface area of the test pad. A second conductive path couples the test pad to the second microbump.

20 Claims, 7 Drawing Sheets

Related U.S. Application Data continuation of application No. 15/481,891, filed on Apr. 7, 2017, now Pat. No. 10,175,294, which is a continuation of application No. 15/170,062, filed on Jun. 1, 2016, now Pat. No. 9,618,572, which is a continuation of application No. 14/833,950, filed on Aug. 24, 2015, now Pat. No. 9,372,206, which is a continuation of application No. 14/331,791, filed on Jul. 15, 2014, now Pat. No. 9,116,203, which is a continuation of application No. 13/025,931, filed on Feb. 11, 2011, now Pat. No. 8,797,057.

(51) Int. Cl.
  *H01L 23/00* (2006.01)
  *G01R 1/04* (2006.01)
  *G01R 31/26* (2020.01)

(52) U.S. Cl.
  CPC ..... *G01R 31/2884* (2013.01); *G01R 31/2886* (2013.01); *G01R 31/2889* (2013.01); *G01R 31/2893* (2013.01); *H01L 22/32* (2013.01); *H01L 24/06* (2013.01); *H01L 24/03* (2013.01); *H01L 24/05* (2013.01); *H01L 24/11* (2013.01); *H01L 24/13* (2013.01); *H01L 2224/02377* (2013.01); *H01L 2224/0392* (2013.01); *H01L 2224/0401* (2013.01); *H01L 2224/05027* (2013.01); *H01L 2224/05147* (2013.01); *H01L 2224/05552* (2013.01); *H01L 2224/05568* (2013.01); *H01L 2224/05655* (2013.01); *H01L 2224/0614* (2013.01); *H01L 2224/0616* (2013.01); *H01L 2224/1146* (2013.01); *H01L 2224/1147* (2013.01); *H01L 2224/11849* (2013.01); *H01L 2224/13005* (2013.01); *H01L 2224/13083* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/14131* (2013.01); *H01L 2224/16238* (2013.01)

(58) Field of Classification Search
  CPC ... G01R 31/2893; G01R 1/0416; H01L 24/06; H01L 24/03; H01L 24/05; H01L 24/11; H01L 24/13; H01L 2224/02377; H01L 2224/0392; H01L 2224/0401; H01L 2224/05027; H01L 2224/05147; H01L 2224/05552; H01L 2224/05568; H01L 2224/05655; H01L 2224/0614; H01L 2224/0616; H01L 2224/1146; H01L 2224/1147; H01L 2224/11849; H01L 2224/13005; H01L 2224/13083; H01L 2224/13111; H01L 2224/13113; H01L 2224/13116; H01L 2224/13139; H01L 2224/13147; H01L 2224/13155; H01L 2224/14131; H01L 2224/16238; H01L 22/32
  USPC ..... 324/754, 756.07, 757, 758; 438/18, 613, 438/614
  See application file for complete search history.

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,406,210 A | 4/1995 | Pedder | |
| 5,481,133 A | 1/1996 | Hsu | |
| 5,554,940 A * | 9/1996 | Hubacher | H01L 24/06 324/762.03 |
| 5,678,301 A * | 10/1997 | Gochnour | H05K 3/4007 257/69 |
| 5,726,075 A * | 3/1998 | Farnworth | H01L 24/11 438/18 |
| 5,789,271 A * | 8/1998 | Akram | H01L 21/4853 257/E23.067 |
| 5,807,787 A * | 9/1998 | Fu | H01L 21/31138 257/E21.256 |
| 5,808,360 A | 9/1998 | Akram | |
| 5,834,366 A | 11/1998 | Akram | |
| 5,834,945 A | 11/1998 | Akram et al. | |
| 6,002,177 A | 12/1999 | Gaynes et al. | |
| 6,016,060 A * | 1/2000 | Akram | G01R 1/0466 324/754.08 |
| 6,060,891 A | 5/2000 | Hembree et al. | |
| 6,091,252 A | 7/2000 | Akram et al. | |
| 6,184,066 B1 | 2/2001 | Chino et al. | |
| 6,187,678 B1 | 2/2001 | Gaynes et al. | |
| 6,188,232 B1 * | 2/2001 | Akram | G01R 1/0483 324/756.02 |
| 6,229,216 B1 | 5/2001 | Ma et al. | |
| 6,236,115 B1 | 8/2001 | Gaynes et al. | |
| 6,271,059 B1 * | 8/2001 | Bertin | H01L 23/13 257/E21.511 |
| 6,279,815 B1 | 8/2001 | Correia et al. | |
| 6,313,651 B1 * | 11/2001 | Hembree | G01R 1/0483 324/756.02 |
| 6,314,641 B1 | 11/2001 | Akram | |
| 6,333,522 B1 * | 12/2001 | Inoue | H01L 33/32 257/81 |
| 6,335,271 B1 | 1/2002 | Fukuyama | |
| 6,342,399 B1 * | 1/2002 | Degani | H01L 24/13 438/14 |
| 6,355,501 B1 | 3/2002 | Fung et al. | |
| 6,434,016 B2 | 8/2002 | Zeng et al. | |
| 6,437,990 B1 | 8/2002 | Degani et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,617,687 B2 | 9/2003 | Akram et al. | |
| 6,661,085 B2 | 12/2003 | Kellar et al. | |
| 6,762,076 B2 | 7/2004 | Kim et al. | |
| 6,765,228 B2 * | 7/2004 | Lin | G01R 31/2884 257/48 |
| 6,790,748 B2 | 9/2004 | Kim et al. | |
| 6,798,224 B1 * | 9/2004 | Hembree | G01R 31/2886 324/754.12 |
| 6,825,541 B2 * | 11/2004 | Huang | H01L 24/13 257/459 |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,061,263 B1 * | 6/2006 | Ong | G01R 31/2884 324/750.3 |
| 7,084,487 B1 | 8/2006 | Conn | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,355,264 B2 | 4/2008 | Degani et al. | |
| 7,402,442 B2 | 7/2008 | Condorelli et al. | |

(56) References Cited

U.S. PATENT DOCUMENTS

| | | | |
|---|---|---|---|
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,642,128 B1 | 1/2010 | Lin et al. | |
| 7,776,627 B2 | 8/2010 | Jeng et al. | |
| 7,834,450 B2 | 11/2010 | Kang | |
| 7,834,453 B2* | 11/2010 | Chang | H05K 3/4007 257/737 |
| 8,067,837 B2* | 11/2011 | Lin | H01L 24/13 257/758 |
| 8,232,553 B2* | 7/2012 | Kim | H01L 27/0296 257/48 |
| 8,237,274 B1 | 8/2012 | Rahman | |
| 8,558,229 B2* | 10/2013 | Jeng | H01L 23/49838 257/48 |
| 8,609,526 B2* | 12/2013 | Liu | H01L 21/0206 438/614 |
| 8,659,155 B2* | 2/2014 | Cheng | H01L 24/16 257/738 |
| 8,691,601 B2 | 4/2014 | Izuha | |
| 8,797,057 B2* | 8/2014 | Wu | G01R 31/2601 324/756.07 |
| 9,116,203 B2* | 8/2015 | Wu | G01R 31/2889 |
| 9,349,697 B2* | 5/2016 | Ooi | H01L 25/0655 |
| 9,372,206 B2* | 6/2016 | Wu | G01R 31/2886 |
| 9,570,366 B2* | 2/2017 | Jeng | H01L 24/11 |
| 9,618,572 B2* | 4/2017 | Wu | H01L 24/06 |
| 9,817,029 B2* | 11/2017 | Wang | G01R 1/07342 |
| 9,829,510 B2 | 11/2017 | Seo et al. | |
| 10,175,294 B2* | 1/2019 | Wu | G01R 1/0416 |
| 10,371,717 B2* | 8/2019 | Garibay | H01L 24/17 |
| 10,593,645 B2* | 3/2020 | Shikibu | H01L 24/14 |
| 2001/0026013 A1* | 10/2001 | Mess | H01L 23/055 257/686 |
| 2006/0195020 A1 | 8/2006 | Martin et al. | |
| 2008/0251906 A1 | 10/2008 | Eaton et al. | |
| 2008/0308297 A1 | 12/2008 | Jurenka et al. | |
| 2009/0050887 A1* | 2/2009 | Kim | H01L 23/5387 257/48 |
| 2009/0134391 A1* | 5/2009 | Lin | G01R 31/31905 257/48 |
| 2009/0218571 A1 | 9/2009 | Chen et al. | |
| 2010/0213600 A1 | 8/2010 | Lau et al. | |
| 2011/0042820 A1 | 2/2011 | Knickerbocker | |
| 2011/0092064 A1* | 4/2011 | Liu | H01L 21/0206 438/612 |
| 2012/0126840 A1* | 5/2012 | Lee | H01L 22/32 324/750.3 |
| 2012/0206160 A1* | 8/2012 | Wu | G01R 31/2601 324/756.07 |
| 2012/0261662 A1* | 10/2012 | Liang | H01L 25/0657 257/48 |
| 2013/0147032 A1* | 6/2013 | Jeng | H01L 21/76885 257/737 |
| 2013/0147505 A1* | 6/2013 | Wang | G01R 1/07342 324/755.01 |
| 2013/0200528 A1 | 8/2013 | Lin et al. | |
| 2014/0014959 A1* | 1/2014 | Jeng | H01L 21/76885 257/48 |
| 2014/0327464 A1* | 11/2014 | Wu | G01R 31/2886 324/756.07 |
| 2015/0362526 A1* | 12/2015 | Wu | G01R 31/2601 324/756.01 |
| 2016/0274183 A1* | 9/2016 | Wu | H01L 22/32 |
| 2017/0033085 A1* | 2/2017 | Shikibu | H01L 23/49541 |
| 2017/0212167 A1* | 7/2017 | Wu | G01R 31/2601 |
| 2019/0128958 A1* | 5/2019 | Wu | H01L 22/32 |
| 2020/0264231 A1* | 8/2020 | Wu | G01R 31/2601 |

OTHER PUBLICATIONS

Non-Final Office Action dated Dec. 5, 2013 for U.S. Appl. No. 13/025,931.

Notice of Allowance dated Dec. 5, 2013 for U.S. Appl. No. 13/025,931.

Non-Final Office Action dated Jan. 9, 2015 for U.S. Appl. No. 14/331,791.

Notice of Allowance dated Apr. 22, 2015 for U.S. Appl. No. 14/331,791.

Notice of Allowance dated Feb. 22, 2016 for U.S. Appl. No. 14/833,950.

Non-Final Office Action dated Jul. 15, 2016 for U.S. Appl. No. 15/170,062.

Notice of Allowance dated Nov. 28, 2016 for U.S. Appl. No. 15/170,062.

Non-Final Office Action dated Jun. 26, 2018 for U.S. Appl. No. 15/481,891.

Notice of Allowance dated Nov. 23, 2018 for U.S. Appl. No. 15/481,891.

Non-Final Office Action dated Oct. 4, 2019 for U.S. Appl. No. 16/232,373.

Notice of Allowance dated Jan. 23, 2020 for U.S. Appl. No. 16/232,373.

Yaglioglu et al., Direct Connection and Testing of TSV and Microbump Devices using Nano Pierce™ Contactor for 3D-IC Integration. 2012 IEEE 30th VLSI Test Symposium (VTS) (Year: 2012).

Mohamed Atalla. Biographical Information with death date for prior art date. db0nus869y26v.cloudfront.net/en/Mohamed_Atalla. 2019 (Year: 2019).

Noice et al., Physical Design Implementation for 3D IC—Methodology and Tools, Mar. 2010. (Year: 2010).

Eldridge et al., Direct Connection and Testing of TSV and Microbump Devices using Nano Pierce™ Contactor for 3D-IC Integration. 2012 IEEE 30th VLSI Test Symposium (VTS) (Year: 2012).

\* cited by examiner

TESTING OF SEMICONDUCTOR CHIPS WITH MICROBUMPS

REFERENCE TO RELATED APPLICATIONS

This application is a Continuation of U.S. application Ser. No. 16/232,373, filed on Dec. 26, 2018, which is a Continuation of U.S. application Ser. No. 15/481,891, filed on Apr. 7, 2017 (now U.S. Pat. No. 10,175,294, issued on Jan. 8, 2019), which is a Continuation of U.S. application Ser. No. 15/170,062, filed on Jun. 1, 2016 (now U.S. Pat. No. 9,618,572, issued on Apr. 11, 2017), which is a Continuation of U.S. application Ser. No. 14/833,950, filed on Aug. 24, 2015 (now U.S. Pat. No. 9,372,206, issued on Jun. 21, 2016), which is a Continuation of U.S. application Ser. No. 14/331,791, filed on Jul. 15, 2014 (now U.S. Pat. No. 9,116,203, issued on Aug. 25, 2015), which is a Continuation of U.S. application Ser. No. 13/025,931, filed on Feb. 11, 2011 (now U.S. Pat. No. 8,797,057, issued on Aug. 5, 2014). The contents of the above-referenced Patent Applications are hereby incorporated by reference in their entirety.

FIELD

This disclosure relates generally to integrated circuits, and more particularly to testing of semiconductor chips with microbumps.

BACKGROUND

Integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

The volume occupied by the integrated components is near the surface of the semiconductor wafer. Although dramatic improvements in lithography have resulted in considerable improvements in two-dimensional (2D) integrated circuit formation, there are physical limitations to the density that can be achieved in two dimensions. One of these limitations is the minimum size needed to make these components. Further, when more devices are put into one chip, more complex designs are required. An additional limitation comes from the significant gains in the number and length of interconnections between devices as the number of devices increases. When the number and length of interconnections increase, both circuit resistive-capacitive (RC) delay and power consumption increase.

Three-dimensional integrated circuits (3DIC) were thus formed to address issues raised by increase in circuit densities. The dies are stacked, with wire-bonding, flip-chip bonding, and/or through-silicon vias (TSV) being used to stack the dies together and to connect the dies to package substrates. Circuit probe (CP) testing of advanced semiconductor chips and 3DIC with high device density becomes challenging.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1:
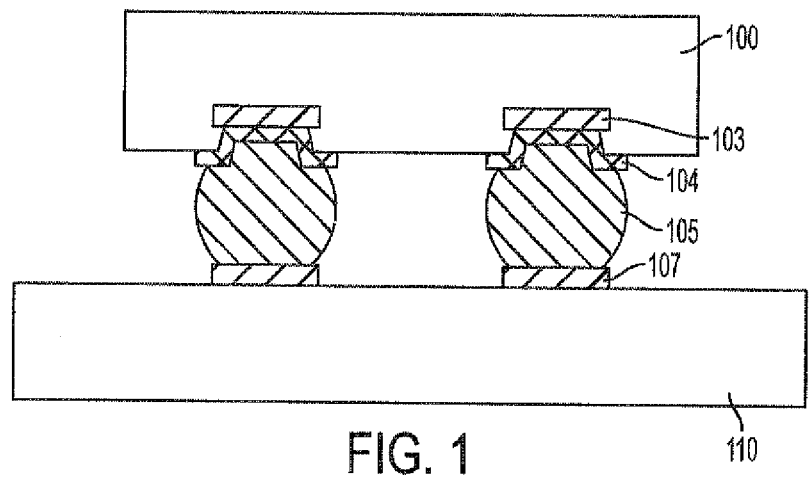
FIG. 1 shows a schematic diagram of an integrated circuit (IC) chip on a package substrate, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Modern integrated circuits are made of millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through these bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package.

FIG. 1 shows a schematic diagram of an integrated circuit (IC) chip 100 on a package substrate 110, in accordance with some embodiments. IC chip 100 is packaged with flip-chip packaging by forming bumps 105 on the front-side of the IC chip 100. Bumps 105 electrically and possibly physically contact the I/O pads (metal pads) 103 of the IC chip 100. In some embodiments, there is an under bump metallurgy (UBM) layer 104 between the bumps 105 and the metal pads 103. The IC chip 100 with the bumps 105 is flipped over to be placed on a package substrate 110. The surface of substrate 110 may have metal pads 107 to receive bumps 105. In some embodiments, the space between and around the IC chip 100, the bumps 105 and the substrate 100 could be filled with an under-fill material (not shown). The embodiment shown in FIG. 1A is merely an example. Other embodiments are also possible. IC chip 100 with bumps 105 could be applied on other types of substrates, such as an application board, and a substrate with embedded passive and/or active devices.

Conventionally, the sizes of the flip chip bumps are equal to or greater than about 75 µm. The sizes of the conventional flip chip bumps allow the semiconductor chips connected to the bumps to be electrically tested to determine whether the circuits under (or connected) to the bumps pass functional tests. Sometimes such as tests may also called circuit probe (CP), or electronic die sort (EDS).

Figure 2:
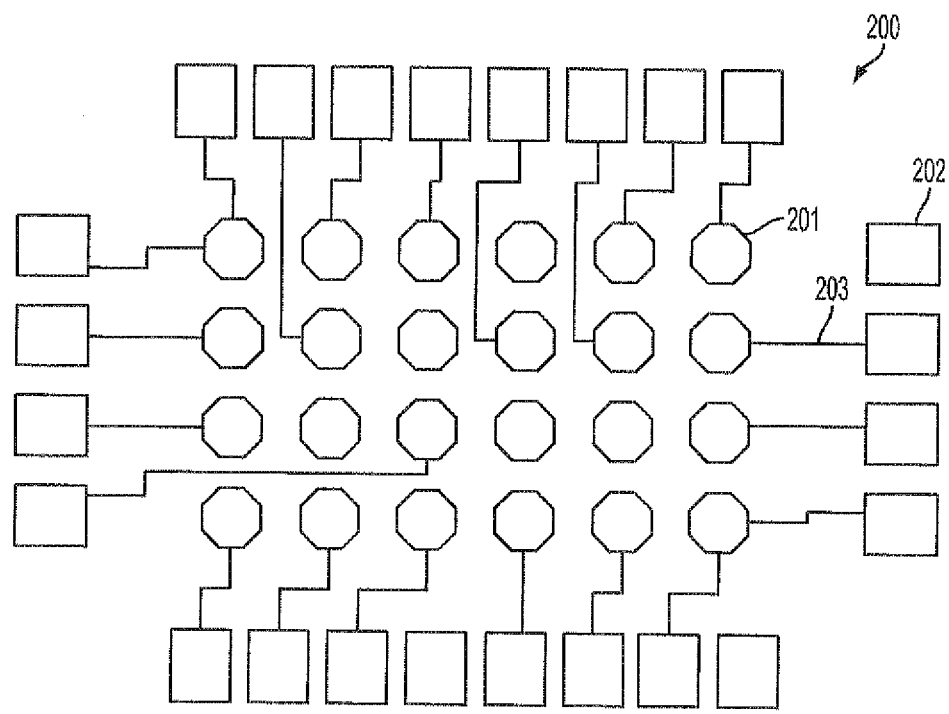
FIG. 2 shows a top schematic view of a portion of a semiconductor chip with bumps, in accordance with some embodiments.

Conventional bumps, such as bumps 105, can be probed for such tests. Alternatively, test pads can be added to allow functional tests. FIG. 2 shows a top schematic view of a portion 200 of a semiconductor chip with bumps, in accordance with some embodiments. The metal pads (or bump pads) 201 under bumps are represented by octagons in FIG. 2. As shown in FIG. 1, bumps (not shown) may be placed directly above these metal pads. There are a number of test pads 202 surrounding the metal pads 201 (and bumps above them). The test pads are connected to the metal pads via conductive lines 203. The conductive lines may be redistribution lines (RDLs), which are formed above the metal pads under the bumps, metal lines, or post-passivation interconnects (PPI). The test pads 202 may be at the same or at different level as the conductive lines 203. The test pads 202 are connected to different bumps 201 to perform functional tests. However, placing the test pads 202 around the bumps 201 takes away the real-estate on the surface of the semiconductor chip.

As feature size scales down, the number of transistors and interconnects on a chip has increased continuously. As a result, the number of chip to package input/output (I/O) interconnects have also increased significantly. With the increased chip to package I/O interconnects, the sizes of bumps could be reduced to equal to or less than about 50 µm. Such reduced-size bumps are called "microbumps."

Figure 3:
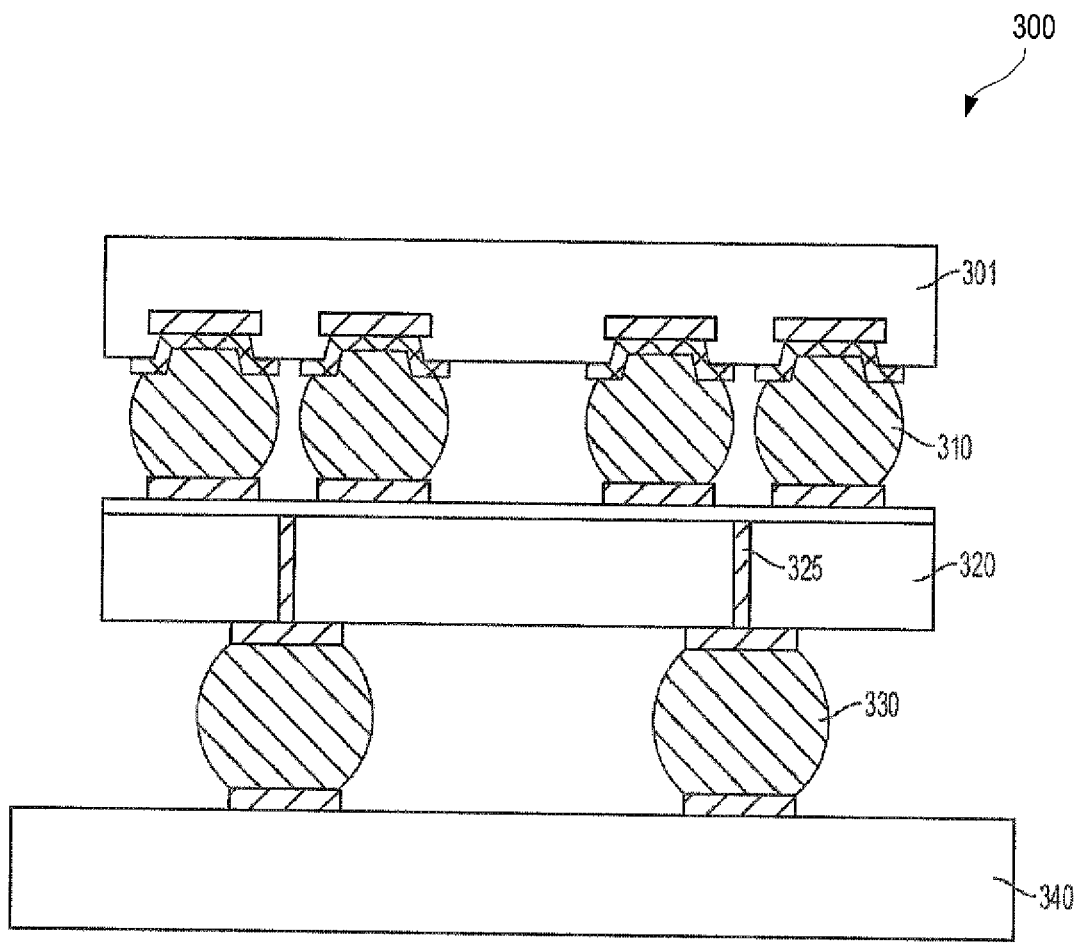
FIG. 3 shows a schematic diagram of a packaged semiconductor chip involving microbumps, in accordance with some embodiments.

FIG. 3 shows a schematic diagram of a packaged semiconductor chip involving microbumps, in accordance with some embodiments. A semiconductor chip 300 (a flipped chip) is disposed on a silicon substrate 320, which has through silicon vias 325 for assisting heat dissipation. The silicon substrate 320 may or may not have active devices on the substrate. The semiconductor chip 300 is connected to silicon substrate 320 via microbumps 310. The silicon substrate 320 is placed on another package substrate 340, with bumps 330, which are regular bumps and are larger than microbumps 310.

After semiconductor chip 300 is prepared, and before it is placed on substrate 320, it is desirable to perform electrical tests on chip 300 to determine if the circuits on chip 300 meet the specification of functional tests. If the test results show problems with chip 300, chip 300 could be discarded and another good chip could be used instead. Such screening can prevent the entire package shown in FIG. 3 from being discarded and can increase package yield, which would result in cost-saving.

As mentioned above, conventional flip chip bumps, with sizes equal to or greater than about 75 µm, allow circuit probing (or electrical tests). However, the current circuit probes are too large for microbumps (or µbumps). For example, the sizes (or widths) of the tips of probes may be in a range from about 2.5 mil to about 5 mil, which are too large for microbumps. An alternative for testing semiconductor chips with microbumps would be to use test pads, such as those described in FIG. 2. However, test pads occupy the precious real-estate on the surface of the semiconductor chip, as mentioned above.

As mentioned above, regular bumps are much larger than microbumps. For example, regular bumps have diameters in a range from about 75 µm to about 150 µm. In contrast, the diameters of microbumps are in a range from about 20 µm to about 50 µm, in accordance with some embodiments. As a result, extra space on the surface of semiconductor may become available due to the usage of microbumps.

Figure 4A:
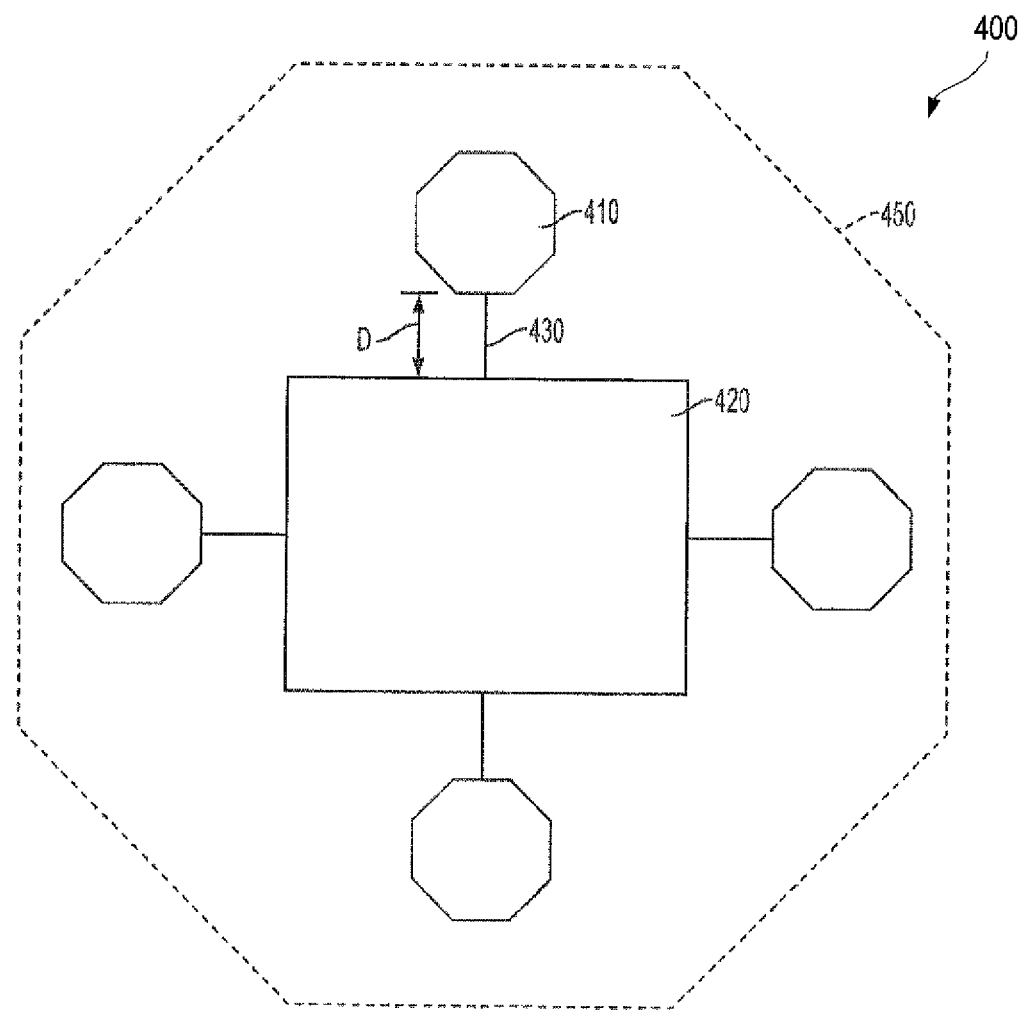
FIG. 4A shows a top view of a number of microbumps surrounding a test pad, in accordance with some embodiments.
Figure 4B:
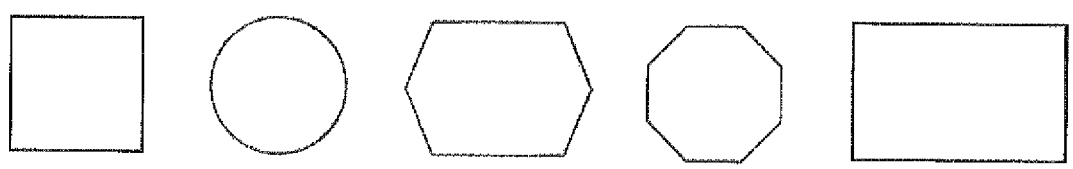
FIG. 4B shows examples of shapes of the testing pads described above, in accordance with some embodiments.

FIG. 4A shows a top view 400 of a number of bump pads 410 surrounding a test pad 420, in accordance with some embodiments. FIG. 4A shows 4 bump pads 410 surrounding the test pad 420. The bump pads 410 are connected to test pad 420 via metal lines 430. Due to the smaller size of the microbumps, the bump pads 410 are also smaller, with widths only slightly larger than the 20 µm to about 50 µm. The exemplary bump pads 410 are shown to be in octagonal shape in FIG. 4A. Other shapes are also possible. The testing pad 420 is shown in FIG. 4A to be a square. The test pad 420 may also be in other shapes, such as a circle, a hexagon, an octagon, a rectangle, or other polygons. FIG. 4B shows examples of shapes of the testing pads 420 described above, in accordance with some embodiments. The smallest width of the test pads 420 is greater than about 60 µm, which allows probing tests, in accordance with some embodiments. The distance D between the bump pads 410 and the test pad 420 is in a range from about 20 µm to about 80 µm.

Since the microbumps are smaller than regular bumps, the surface space saved from using microbumps, instead of using regular bumps, could be used for the testing pads. Using the surface saved by using microbumps for test pad(s) can minimize the impact of the test pads occupying the real-estate of the surface of a semiconductor chip. FIG. 4A shows a pad area 450 for a regular bump, in accordance of some embodiments. The microbumps 410 and the testing pad 420 are within the pad area 450 of a regular bump. The microbumps 410 and the testing pad 420 could also occupy an area slightly larger than the pad area 450 of a regular bump. However, the usage of microbumps saves surface real-estate and can minimize the impact of having a test pad(s).

Figure 4C:
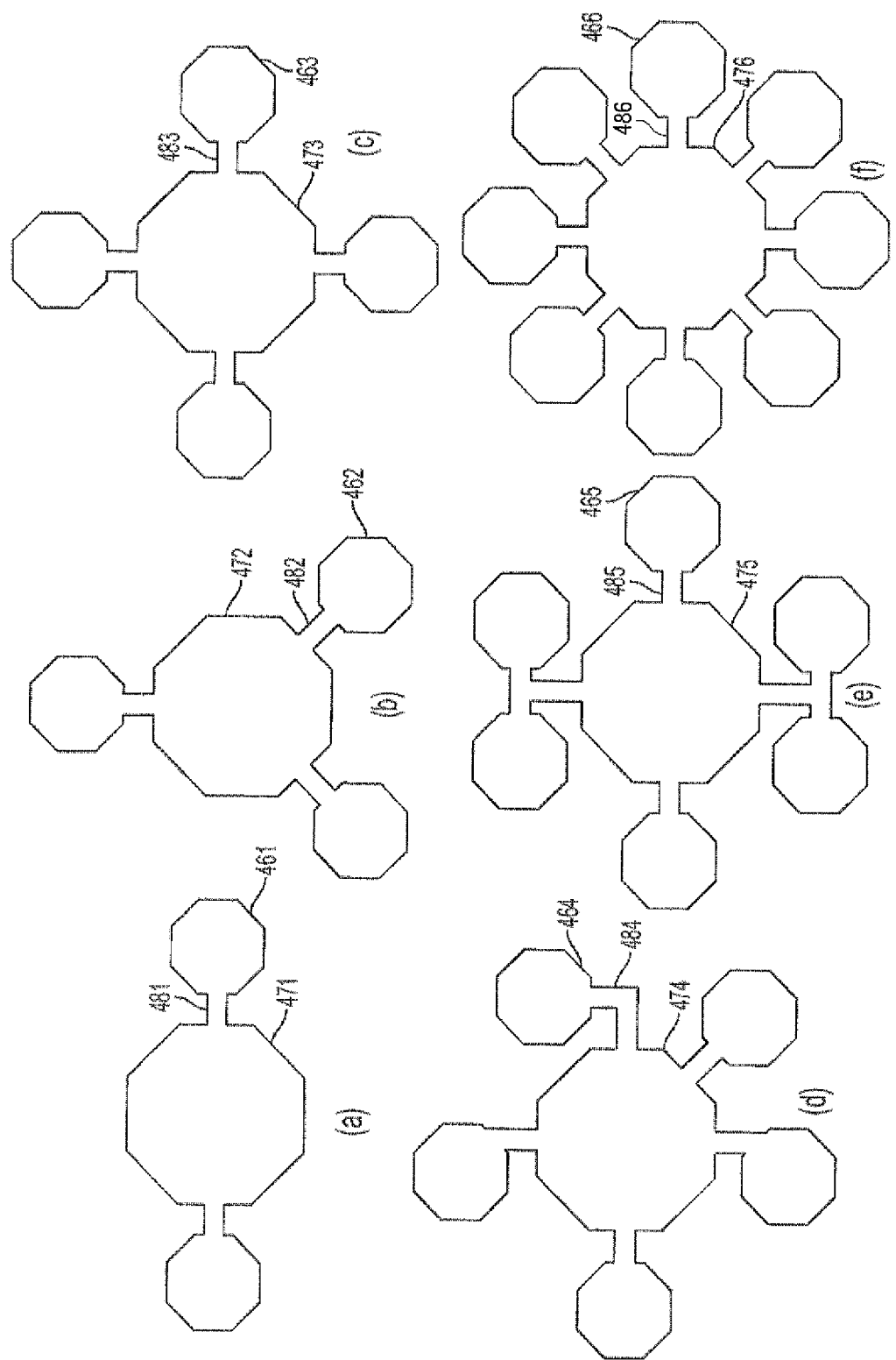
FIG. 4C (a)-(f) show a top view of a number of configurations of microbumps with test pads, in accordance with some embodiments.

FIG. 4C (a)-(f) show a top view of a number of configurations of microbumps with test pads, in accordance with some embodiments. In FIG. 4C (a)-(f), the bump pads 461, 462, 463, 464, 465, and 466 surround the test pads 471, 472, 473, 474, 475, and 476 and are distributed symmetrically around the test pads. The probing areas are within the test pads due to coverage of edge areas by a passivation layer. Similarly, the microbumps are placed within the bump pads. The bump pads and testing pads are connected to one another via conductive lines 491, 492, 493, 494, 495, and 496, which are on the same level or different level of the metal pads, 461-466 and 471-476. The testing pads are illustrated to be in octagonal shapes. However, they could be in other shapes, as described in FIG. 4B. The bump pads under the microbumps are shown in octagonal shapes, which are also merely exemplary.

The number of bump pads (or microbumps) could be in a range from 2 to 8, in accordance with some embodiments. For smaller microbumps, the number of bumps can be even higher. Different numbers of microbumps could be connected to the test pads to allow performing functional tests of different devices connected to the same I/O connections and/or under the same input signals. For example, some functions of the semiconductor chip could involve applying or pulling signals (or current) from devices connected to a number of bumps. The different connections shown in FIG. 4C (a)-(f) allow such testing. The symmetrical configuration of bump pads for microbumps could make stress distribution due to the formation of microbumps more even, which could reduce the chance of interface delamination for the microbumps.

Figure 4D:
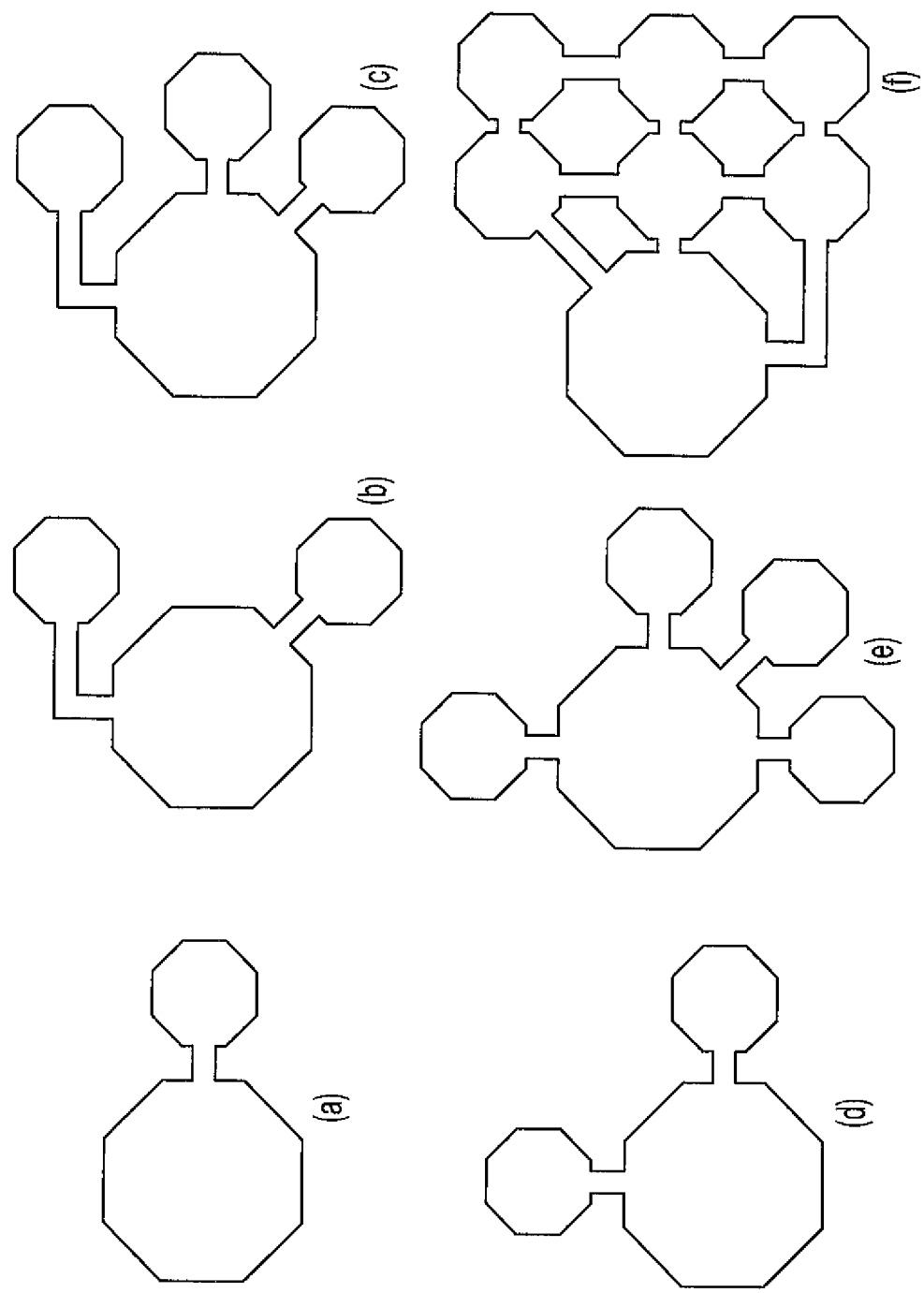
FIG. 4D (a)-(f) show a top view of a number of configurations of microbumps with test pads, in accordance with some other embodiments.

Alternatively, the microbumps do not need to be distributed symmetrically around the testing pads. FIG. 4D (a)-(f) show a top view of a number of configurations of microbumps with test pads, in accordance with some other embodiments. FIG. 4D (a)-(f) show different numbers of microbumps are connected to the testing pads and are arranged asymmetrically.

In some embodiments, there are a number of test pads with microbumps in some of the arrangements described above on a semiconductor chip. Different combinations could be needed on different chips to complete functional testing of various devices on the chips. For example, different inputs/outputs (I/Os), such as I/Os for signals, power, and ground (or grounding), need different numbers of microbumps due to different current requirement and also the $I_{max}$ (maximum current) limits of microbumps. Therefore, different combinations of numbers of microbumps are needed to allow testing.

Circuit probing can damage the metal pads, which leads to the copper seed layer coverage and poor bump plating (or formation). Poor bump formation could lead to particle and corrosion issues. However, if the testing pads are covered by a passivation layer after the testing is completed, the risks of such issues are completed resolved or greatly reduced.

Figure 5A:
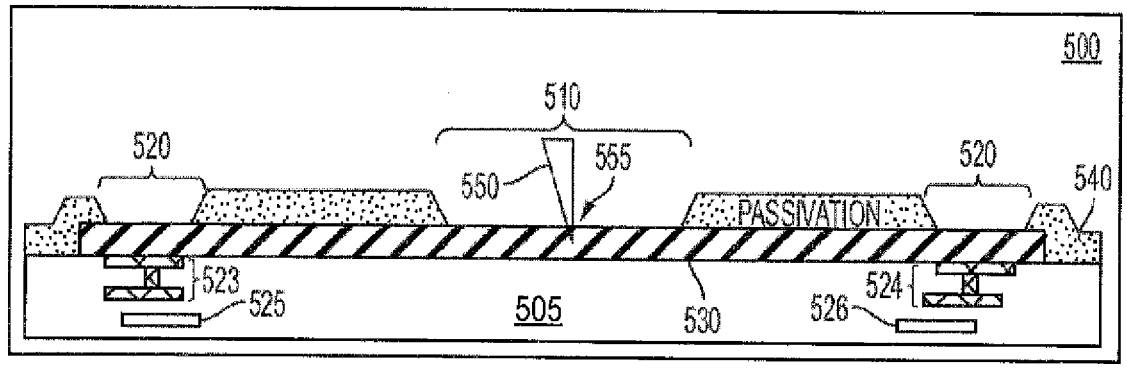
FIGS. 5A-5C are cross-sectional views of a region of a testing pad in a process of probing and formation of microbumps, in accordance with some embodiments.
Figure 5B:
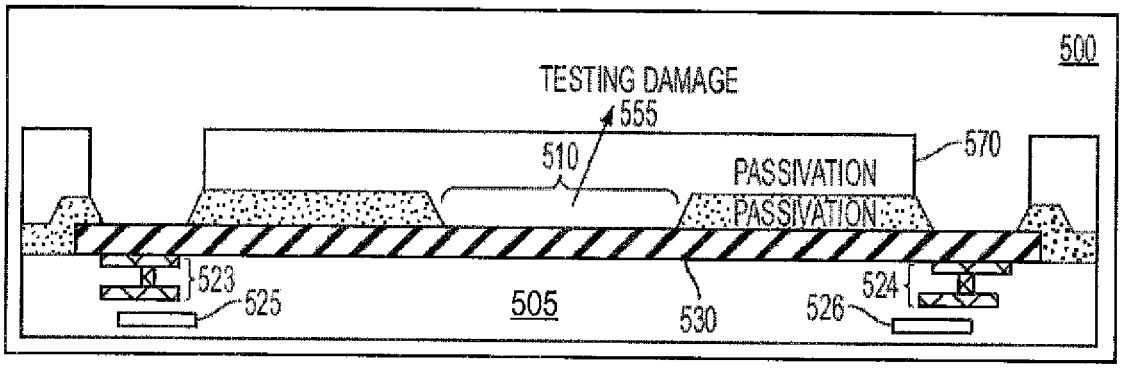
Figure 5C:
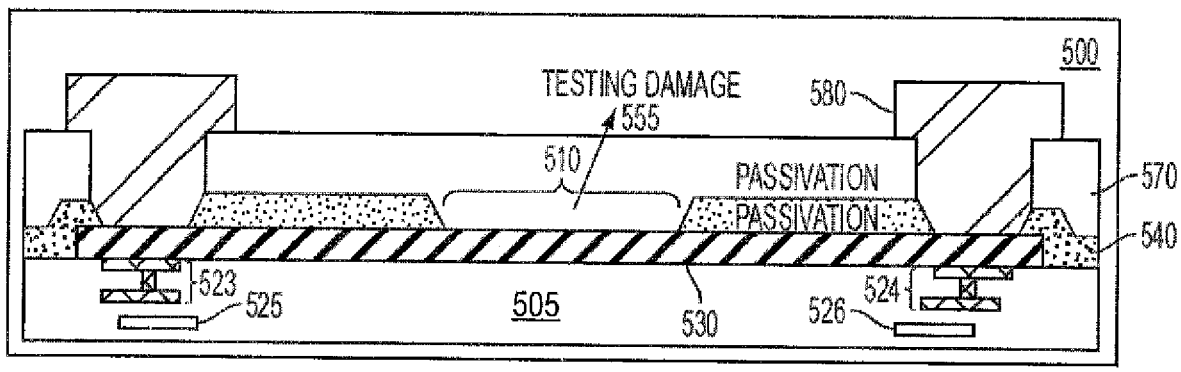

FIGS. 5A-5C are cross-sectional views of a region 500 of a testing pad in a process of probing and formation of microbumps, in accordance with some embodiments. FIG. 5A shows that a test pad region 510 and two opening regions (or bump pads) 520 for forming microbumps. Under the two opening regions (or bump pads) 520 for forming microbumps, there are interconnects 523, 524 connecting the to-be-formed microbumps with devices 525 and 526. The interconnect 523, 524 and devices 525, 526 (on substrate 505) shown in FIG. 5A are merely exemplary. Other configurations and additional interconnects/devices could be involved. The test pad region 510 is formed on a metal pad 530, which could be a top metal layer, a redistribution layer (RDL), or a post passivation interconnect (PPI) layer, in accordance with some embodiments. Regions 520 and test pad region 510 are electrically and physically connected. FIG. 5A shows that the test pad region 510 and the regions 520 are defined by a first passivation layer 540 through lithographical patterning. The first passivation layer 540 is deposited over the metal pad 530. The test pad region 510 is separated from the regions 520 so that the microbumps formed in regions 520 would be physically separated from the test pad 510. The outline(s) of the conductive line(s) between test pad and microbump pad(s) are also defined by the first passivation layer, which is not shown in FIG. 5A.

FIG. 5A shows a probe 550 touching the test pad region 510. The probing causes damage (see region 555) on the surface of the test pad region 510. The probing in test pad region 510 allowed electrical data related to devices connected to regions 520 to be tested. As mentioned above, the regions for forming microbumps that are connected to the test pad could be in a range from 1 to many. After the probing is completed, microbumps will be formed on regions 520. In some other embodiments, an UBM layer (not shown) is formed after the probing is performed. The UBM layer is under the microbumps to provide a diffusion barrier and to enhance adhesion. In some embodiments, the UBM layer (not shown) is formed to cover the openings 520 before probing is performed. The structure of microbumps with details of the UBM layer will be described later. The formation of the UBM layer involves deposition, patterning and etching the UBM layer. After the UBM layer is formed, the substrate a second passivation layer 570 is deposited and patterned to expose regions 520. The second passivation layer 570 may be made of an organic polymer, such as polyimide. In some embodiments, the second passivation layer 570 is made of a photosensitive polyimide. In some other embodiments, the second passivation layer 570 may be a dielectric material, which may be deposited by chemical vapor deposition or by spin-on. For example, the dielectric material may be $SiO_2$, SiN, or other suitable passivation material. The test pad region 520 is covered by the second passivation layer 570; therefore, the issues such as particles and corrosion due to test pad damage are resolved. The damaged area is covered and protected. In some embodiments, the thickness of the second passivation layer 570 is in a range from about 1 μm to about 10 μm. In some other embodiments, the thickness of the second passivation layer 570 is in a range from about 2 μm to about 5 μm.

FIG. 5C shows the microbumps 580 formed on the substrate of FIG. 5B after the second passivation layer 570 is formed, in accordance with some embodiments. The microbumps 580 may be formed by plating, in accordance with some embodiments. Prior to plating the substrate, a photoresist, which could be wet or dry (not shown in FIG. 5C), is patterned over the second passivation layer 570 to define of the microbumps 580 above regions 520. The microbumps can be made of various materials, such as solder or copper. After the microbumps are deposited, substrate 505 may undergo a reflow process.

Figure 6A:
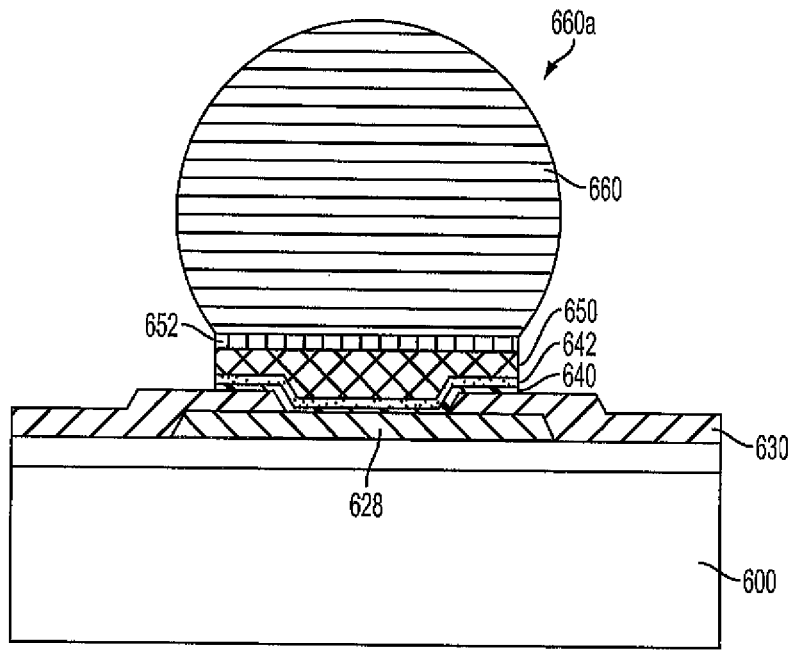
FIG. 6A shows a bump structure on a substrate, in accordance with some embodiments.
Figure 6B:
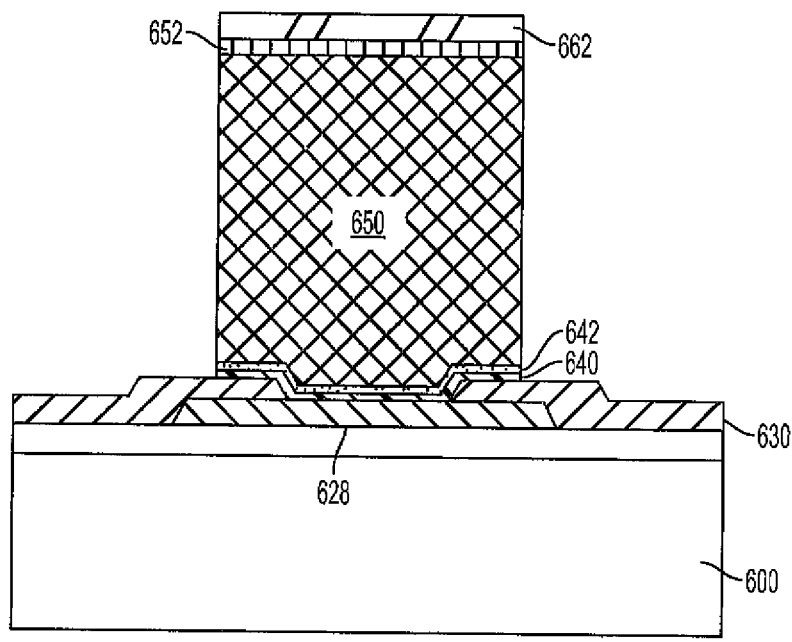
FIG. 6B shows a copper post on a substrate, in accordance with some embodiments.

The structures of microbumps and the processes of forming the microbumps could be similar to regular bumps. FIGS. 6A and 6B show two exemplary structures of microbumps on substrates, in accordance with some embodiments. FIG. 6A shows a bump structure on a substrate 600, in accordance with some embodiments. Metal pad 628, which is used as bump pad, is formed over one or more interconnect structures (not shown). Metal pad 628 may comprise aluminum, and hence may also be referred to as aluminum pad 628, although it may also be formed of, or include, other materials, such as copper, silver, gold, nickel, tungsten, alloys thereof, and/or multi-layers thereof. In some embodiments, a passivation layer 630 is formed to cover edge portions of metal pad 628. The passivation layer 630 may be formed of polyimide or other known dielectric materials. Additional passivation layers may be formed over the interconnect structures (not shown) and at the same level, or over, metal pad 628.

An opening is formed in passivation layer 630, with metal pad 628 exposed. A diffusion barrier layer 640 and a thin seed layer 642 are formed to cover the opening with the diffusion barrier layer 640 in contact with the metal pad 628, in accordance with some embodiments. Diffusion barrier layer 640 may be a titanium layer, a titanium nitride layer, a tantalum layer, or a tantalum nitride layer. The materials of seed layer 642 may include copper or copper alloys, and hence is referred to as copper seed layer 642 hereinafter. However, other metals, such as silver, gold, aluminum, and combinations thereof, may also be included. In some embodiments, diffusion barrier layer 640 and copper seed layer 642 are formed using sputtering.

A copper layer 650 may be deposited or plated on the exposed surface of copper seed layer 642, in accordance with some embodiments. A metal layer 652 may be optionally formed on the copper layer 650. In some embodiments, metal layer 652 is a nickel-containing layer comprising, for example, a nickel layer or a nickel alloy layer by plating. A solder layer 660 is formed on nickel layer 652, for example, by plating. Solder layer 660 may be a lead-free pre-solder layer formed of, for example, SnAg, or a solder material, including alloys of tin, lead, silver, copper, nickel, bismuth, or combinations thereof. A solder reflowing process is performed to form solder bump 660a, as shown in FIG. 6A.

In alternative embodiments, as shown in FIG. 6B, the thickness of copper layer 650 is increased so that copper layer 650 becomes a copper post (or pillar). In some embodiments, after the optional formation of metal layer 652 on copper post 650, a solder layer 662, which may be a thin solder layer, may be plated on metal layer 652. The embodiments shown in FIGS. 6A and 6B are only two examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

The embodiments described above provide mechanisms for performing functional tests on devices connected to microbump pads under microbumps. Test pads that are larger than microbumps are formed to allow such testing. Due to the surface areas saved by using microbumps, the effect of test pads on surface real-estate of semiconductor chips could be reduced to minimum or none. The test pad can be connected to one or more microbump pads during testing. These one or more microbumps may be distributed symmetrically or asymmetrically around the test pads. The test pads could be damaged due to circuit probing and could be covered by a passivation layer after probing to protect the damaged surface.

An aspect of this description relates to a package. The package includes a semiconductor chip. The semiconductor chip includes a test pad, and a plurality of microbump pads, wherein each microbump pad of the plurality of microbump pads is electrically connected to the test pad. The package further includes a substrate; and a plurality of microbumps configured to electrically connect the semiconductor chip to the substrate, wherein each microbump of the plurality of microbumps is electrically connected to a corresponding microbump pad of the plurality of microbump pads. The package further includes a package substrate, wherein the package substrate comprises a bump pad, wherein an area of the bump pad is greater than a combined area of the test pad and the plurality of microbump pads. The package further includes a bump configured to electrically connect the substrate to the package substrate.

Another aspect of this description relates to a test structure. The test structure includes an array of connection pads on a chip, wherein a width of each connection pad of the array of connection pads is equal to or less than about 50 microns (μm). The test structure further includes an interconnect structure connected to the array of connection pads. The test structure further includes an array of test pads around a periphery of the array of connection pads, wherein a test pad of the array of test pads is connected to a corresponding connection pad of the array of connection pads through the interconnect structure, wherein a width of the test pad is greater than a width of the corresponding connection pad, and the test pad is adapted to be covered after circuit probing by a passivation material to prevent particle and corrosion issues.

Still another aspect of this description relates to a method of testing a chip. The method includes probing a test pad with a probe. The test pad is electrically connected to a first microbump pad and a second microbump pad. A size of the probe is larger than the first microbump pad or the second microbump pad. Probing the test pad causes damage to the test pad. The method further includes depositing a passivation layer over the damaged test pad, wherein the passivation layer is configured to prevent particle and corrosion issues.

Various modifications, changes, and variations apparent to those of skill in the art may be made in the arrangement, operation, and details of the methods and systems disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the disclosure is not to be limited to the details given herein, but may be modified within the scope and equivalents of the appended claims.

What is claimed is:

1. A device comprising:
 a test pad on a chip, the test pad being quadrilateral in shape;
 a first microbump pad having a first surface area that is less than a surface area of the test pad, the first microbump pad being arranged proximate to a first edge of the quadrilateral;
 a second microbump pad having a second surface area that is equal to or less than the surface area of the test pad, the second microbump pad being arranged proximate to a second edge of the quadrilateral; and
 a third microbump pad having a third surface area that is less than the surface area of the test pad, the third microbump pad being arranged proximate to a third edge of the quadrilateral.

2. The device of claim 1, wherein the first microbump pad is octagonal in shape.

3. The device of claim 1, wherein the test pad includes an upper surface with probe damage.

4. The device of claim 1, wherein the second microbump pad is arranged proximate to the second edge of the quadrilateral such that the first microbump pad and the second microbump pad are arranged symmetrically about opposite edges of the test pad.

5. The device of claim 4, wherein the second microbump pad is octagonal in shape.

6. The device of claim 4, wherein the first edge is an upper edge of the quadrilateral and the second edge is a lower edge of the quadrilateral.

7. The device of claim 6, further comprising:
 a fourth microbump pad having a fourth surface area that is less than the surface area of the test pad, the fourth microbump pad being arranged proximate to a right edge of the quadrilateral such that the third microbump pad and the fourth microbump pad are arranged symmetrically about the test pad.

8. The device of claim 7, wherein the third microbump pad and the fourth microbump pad are each octagonal in shape.

9. The device of claim 8, wherein each of the first microbump pad, the second microbump pad, the third microbump pad, and the fourth microbump pad have equal surfaces areas.

10. A device comprising:
a test pad on a chip, the test pad being quadrilateral in shape;
a first microbump pad that is octagonal in shape and having a first surface area that is less than a surface area of the test pad, the first microbump pad being arranged proximate to a first edge of the quadrilateral;
wherein the test pad includes an upper surface with probe damage;
a second microbump pad having a second surface area that is less than the surface area of the test pad, the second microbump pad being arranged proximate to a second edge of the quadrilateral; and
a third microbump pad having a third surface area that is less than the surface area of the test pad, the third microbump pad being arranged proximate to a third edge of the quadrilateral.

11. The device of claim 10, wherein a width of the first microbump pad is approximately 50 μm.

12. The device of claim 10, wherein the first edge of the quadrilateral is opposite the second edge of the quadrilateral.

13. The device of claim 10, further comprising:
a fourth microbump pad having a fourth surface area that is less than the surface area of the test pad, the fourth microbump pad being arranged proximate to a fourth edge of the quadrilateral.

14. A test structure for performing electrical tests of devices under one or more microbumps, comprising:
a first chip including a test pad surrounded by two or more microbump structures;
an substrate spaced apart from the first chip; and
wherein the two or more microbump structures extend between the first chip and the substrate.

15. The test structure of claim 14, wherein each of the two or more microbump structures comprises a microbump pad having a microbump pad area that is less than a test pad area of the test pad.

16. The test structure of claim 15, wherein a distance between the microbump pad of a microbump structure and the test pad ranges from about 20 μm to about 80 μm.

17. The test structure of claim 14, wherein the test pad is quadrilateral in shape.

18. The test structure of claim 17, wherein at least one of the two or more microbump structures includes a microbump pad that is octagonal in shape and that has a microbump pad surface area that is less than a surface area of the test pad.

19. The test structure of claim 14, wherein the test pad includes a probe mark thereon.

20. The test structure of claim 14, further comprising a passivation layer over the test pad.

* * * * *